(12) United States Patent
Du et al.

(10) Patent No.: US 6,507,940 B2
(45) Date of Patent: Jan. 14, 2003

(54) METHOD FOR GENERATING INFORMATION FOR A WINDOW VIEW OF AN INTEGRATED CIRCUIT FROM LAYOUT-FORMATTED DATA

(75) Inventors: Yu Du, Fremont, CA (US); Ke-Qin Gu, San Jose, CA (US); Tsung-Yen (Eric) Chen, Fremont, CA (US); Kuo-Chun Lee, Fremont, CA (US)

(73) Assignee: Oridus, Inc., Fremont, CA (US)

( * ) Notice: Subject to any disclaimer, the term of this patent is extended or adjusted under 35 U.S.C. 154(b) by 107 days.

(21) Appl. No.: 09/847,621

(22) Filed: May 2, 2001

(65) Prior Publication Data

US 2002/0166102 A1 Nov. 7, 2002

(51) Int. Cl.$^7$ .............................................. G06F 17/50
(52) U.S. Cl. ............................... 716/11; 716/9; 716/10; 716/12
(58) Field of Search ................................ 716/11, 10, 9, 716/12

(56) References Cited

U.S. PATENT DOCUMENTS

| | | | | |
|---|---|---|---|---|
| 5,325,309 A | * | 6/1994 | Halaviati et al. | 716/11 |
| 6,064,758 A | * | 5/2000 | Jin | 716/11 |
| 6,289,493 B1 | * | 9/2001 | Kita | 716/11 |
| 6,317,864 B1 | * | 11/2001 | Kikuchi et al. | 716/11 |
| 6,351,841 B1 | * | 2/2002 | Tickle | 716/11 |
| 6,430,732 B1 | * | 8/2002 | Hwang et al. | 716/11 |
| 6,434,733 B1 | * | 8/2002 | Duggirala et al. | 716/11 |
| 6,446,245 B1 | * | 9/2002 | Xing et al. | 716/11 |

* cited by examiner

Primary Examiner—Michael Tokar
Assistant Examiner—Lam T. Mai
(74) Attorney, Agent, or Firm—Victor H. Okumoto

(57) ABSTRACT

A method generates information for a window view of an integrated circuit from layout-formatted data such as GDSII formatted data. The method includes generating outer boundary boxes for structures of the integrated circuit from the layout-formatted data, generating a build file by including information of structures having outer boundary boxes completely or partially in a window, and generating information of the window view from the information thus included in the build file. In generating the build file, information of structures having outer boundary boxes completely outside the window are excluded from the build file. Also excluded is information of structures having areas less than a threshold value.

11 Claims, 6 Drawing Sheets

METHOD FOR GENERATING INFORMATION FOR A WINDOW VIEW OF AN INTEGRATED CIRCUIT FROM LAYOUT-FORMATTED DATA

FIELD OF THE INVENTION

The present invention generally relates to the design and analysis of integrated circuits and in particular, to a method for generating information for a window view of an integrated circuit from layout-formatted data.

BACKGROUND OF THE INVENTION

During the design and analysis of an integrated circuit, it is useful at times to allow a remotely located party to view the layout of an integrated circuit as generated from layout-formatted data such as conventional GDSII formatted data. The rendering and transmission of such a view, however, can be very time consuming. As the remote party inspects the layout of the integrated circuit, the remote party also frequently desires to see various zoom-in window views of portions of the layout. To respond to such requests, a common practice is to re-render the entire integrated circuit layout from the layout formatted data before transmitting only the requested zoom-in window view. Needless to say, the long resulting wait for the requested window view can be extremely disheartening to the remote party in an interactive session.

OBJECTS AND SPY OF THE INVENTION

Accordingly, it is an object of the present invention to provide a method for generating information for a window view of an integrated circuit from layout-formatted data that is faster than conventional methods such as described above.

This and additional objects are accomplished by the various aspects of the present invention, wherein briefly stated, one aspect is a method for generating information for a window view of an integrated circuit from layout-formatted data, comprising: generating outer boundary boxes for structures of an integrated circuit from layout-formatted data; generating a build file by including information of a first group of the structures having areas greater than a threshold value and outer boundary boxes completely within a window; and generating information of a window view of the integrated circuit from the information thus included in the build file.

In another aspect, a method for generating information for a window view of an integrated circuit from layout-formatted data, comprises: generating outer boundary boxes for structures of an integrated circuit from layout-formatted data; generating a build file by including information of structures having outer boundary boxes completely within a window, excluding information of structures having outer boundary boxes completely outside the window, and clipping elements of structures having outer boundary boxes partially in and partially out of the window so that portions of the elements within the window are included in the build file and portions of the elements outside the window are excluded from the build file; and generating information of a window view of the integrated circuit from the information thus included in the build file.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENT

Figure 1:
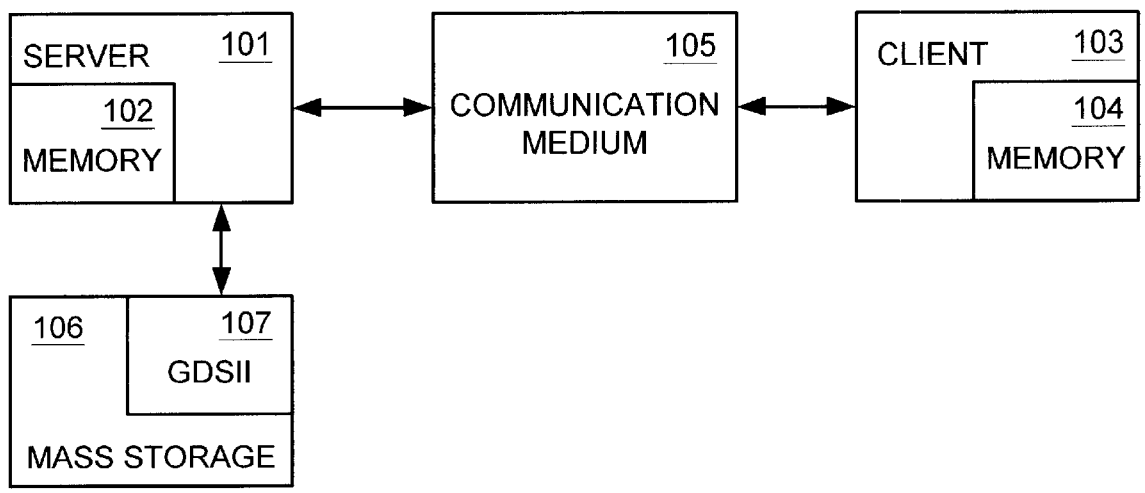
FIG. 1 illustrates a block diagram of a simple client-server system utilizing aspects of the present invention.

FIG. 1 illustrates a block diagram of a client-server system in which window views of an integrated circuit layout are transmitted upon request from a server computer 101 to a client computer 103 over a communication medium 105. The window views are rendered by a rendering program in a system memory 102 of the server computer 101 from layout-formatted data such as stored in GDSII formatted data file 107 on a mass storage device 106 such as a hard disk drive of the server computer 101. After rendering the window view into an image file, an encoding program in the system memory 102 of the server computer 101 encodes the image file into a compressed format to reduce transmission time between the server computer 101 and the client computer 103 over the communication medium 105. The communication medium 105 may be a local area network, modem direct connection, or the Internet. Upon receipt of the encoded and transmitted image file, a decoding program in a system memory 104 of the client computer 103 decodes the image file, and a viewer program in the system memory 104 of the client computer 103 displays the window view contained in the image file on a display screen of the client computer 103.

Figure 2:
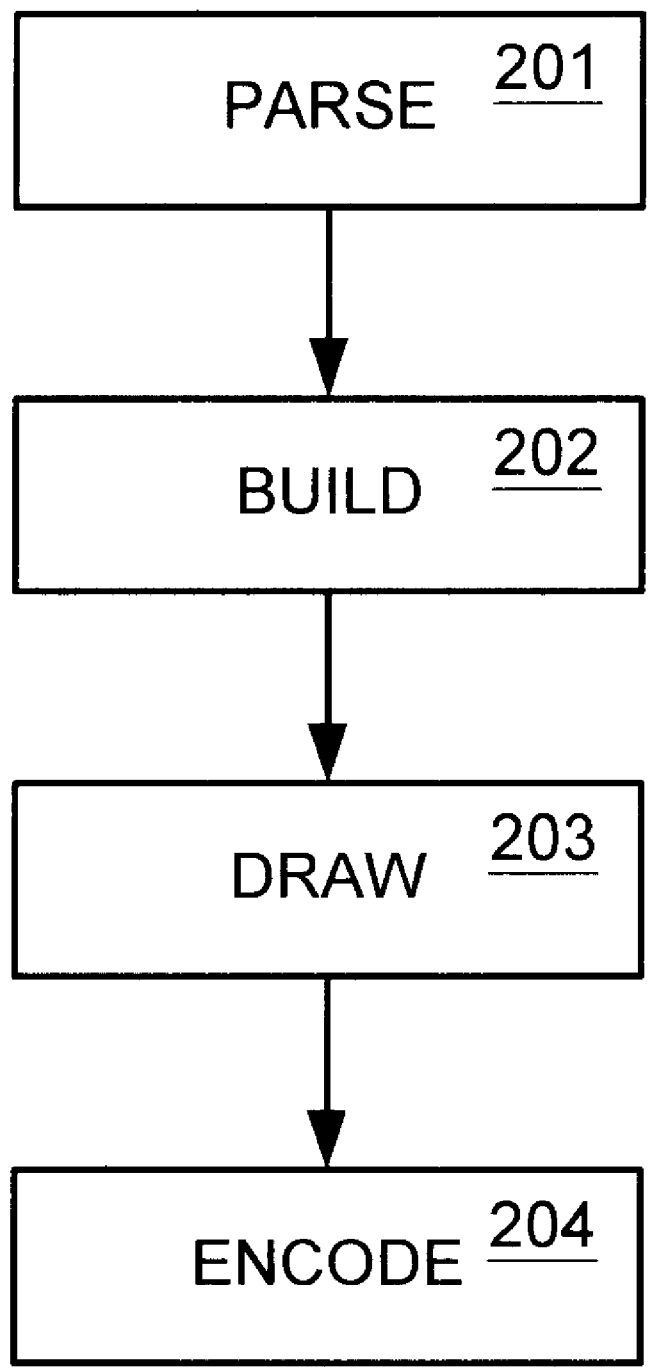
FIG. 2 illustrates a flow diagram of a method for rendering and preparing a view of an integrated circuit layout for transmission, utilizing aspects of the present invention.

FIG. 2 illustrates a flow diagram of a method performed by the rendering and encoding programs in system memory 102 of the server computer 101. In 201, the rendering program parses through the GDSII formatted data file 107 to read all structure information into a file stored on the mass storage 106. Outer boundary boxes for all structures are also generated at this time, and stored in system memory 102 or along with the structure information in the file. The outer boundary boxes represent physical boundaries of the structures determined from their XY coordinates on the physical layout. In 202, the rendering program generates a build file including information of a requested window view of the integrated circuit from the structure information previously generated. In 203, the rendering program or a conventional image-generating program generates an image of the requested window view from the information included in the build file. In 204, the encoder program encodes the generated image into a compressed image file for transmission to the requesting client computer 103.

Figure 3:
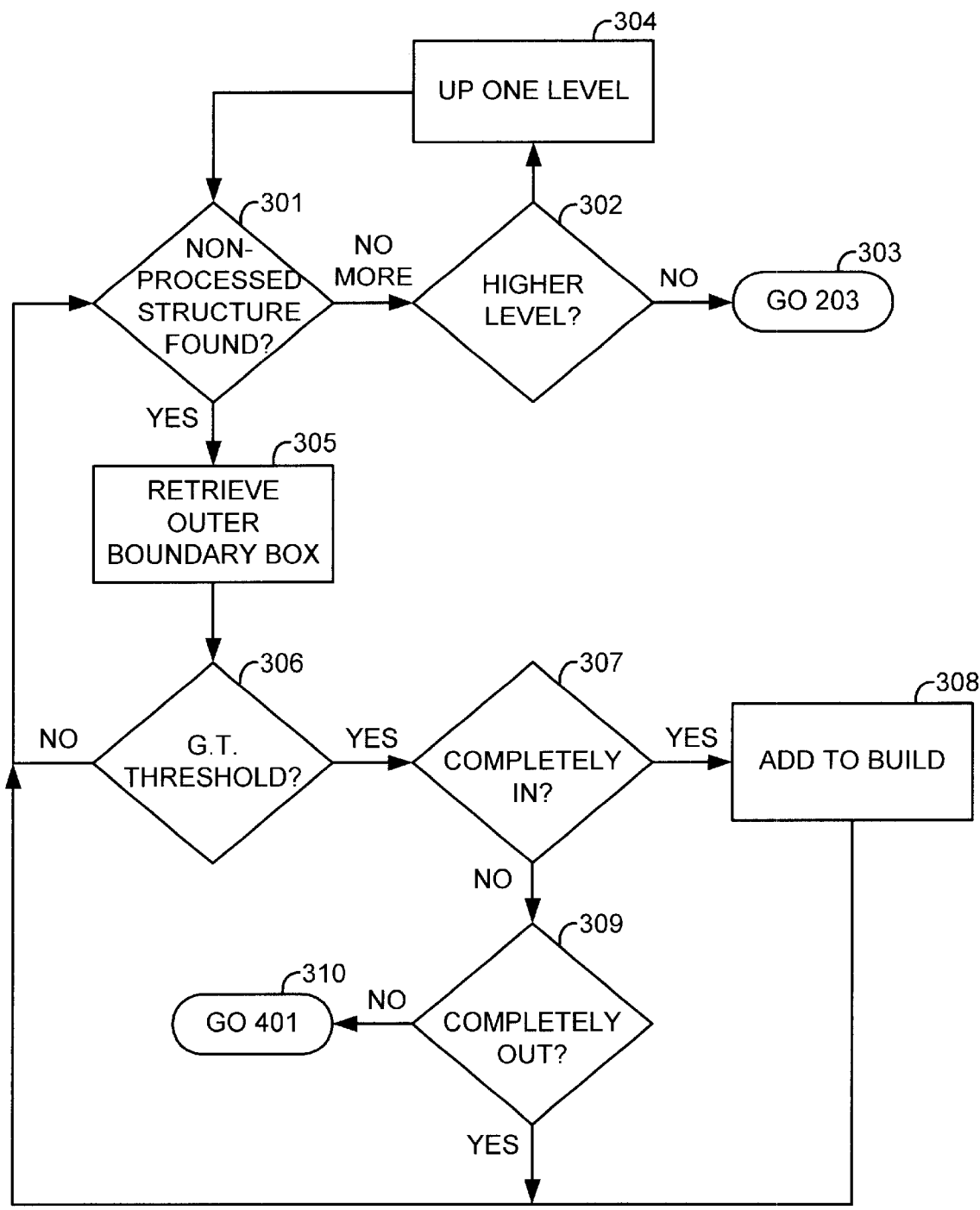
FIGS. 3 and 4 illustrate a flow diagram of a method for generating information for a window view of an integrated circuit from layout-formatted data that is useful for the method described in reference to FIG. 2, utilizing aspects of the present invention.
Figure 4:
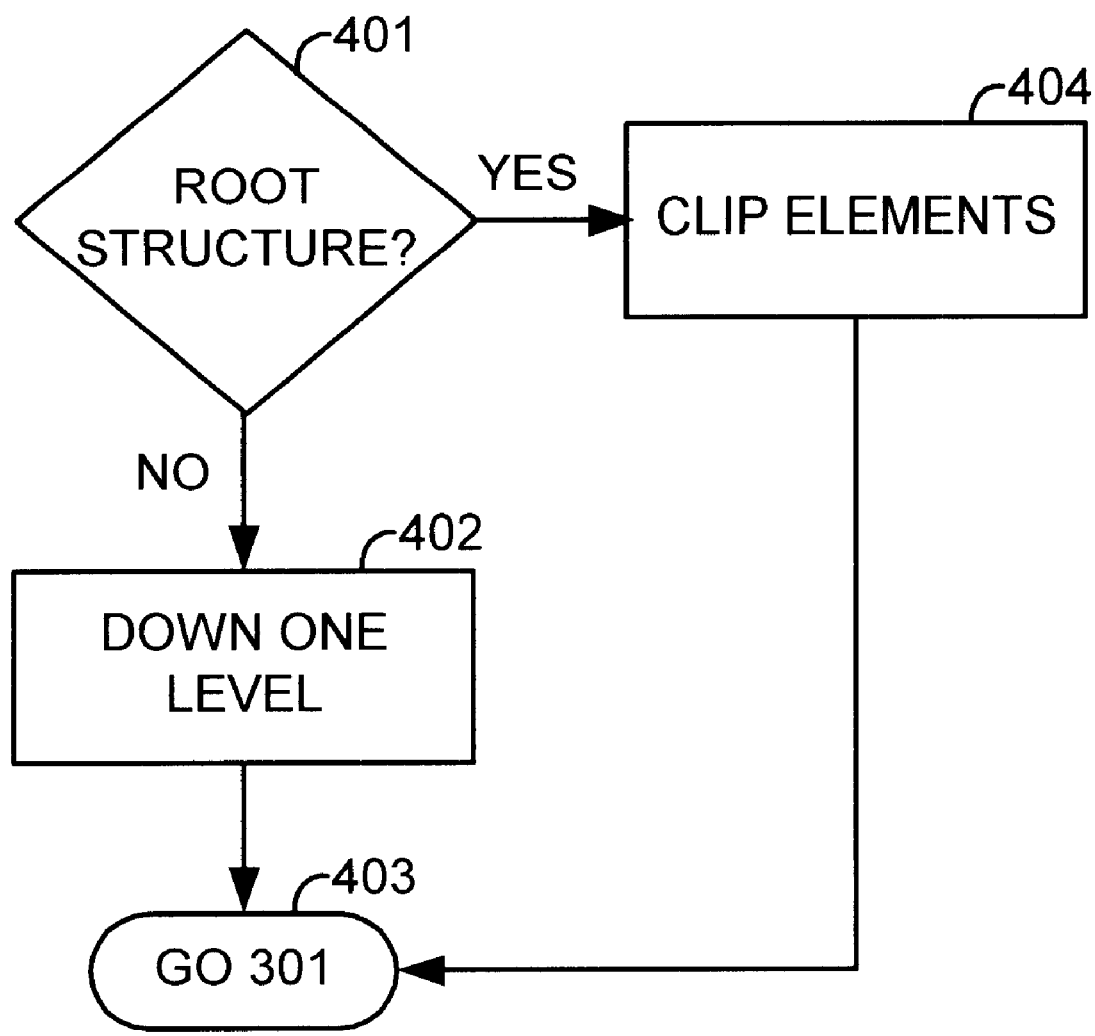

FIGS. 3 and 4 illustrate a flow diagram of a method for generating information for a window view of an integrated circuit from layout-formatted data. The method is preferably used to generate the build file in 202 of FIG. 2. The method is particularly useful when the layout-formatted data is organized in a hierarchical organization of structures such as in the GDSII formatted data file.

Figure 5:
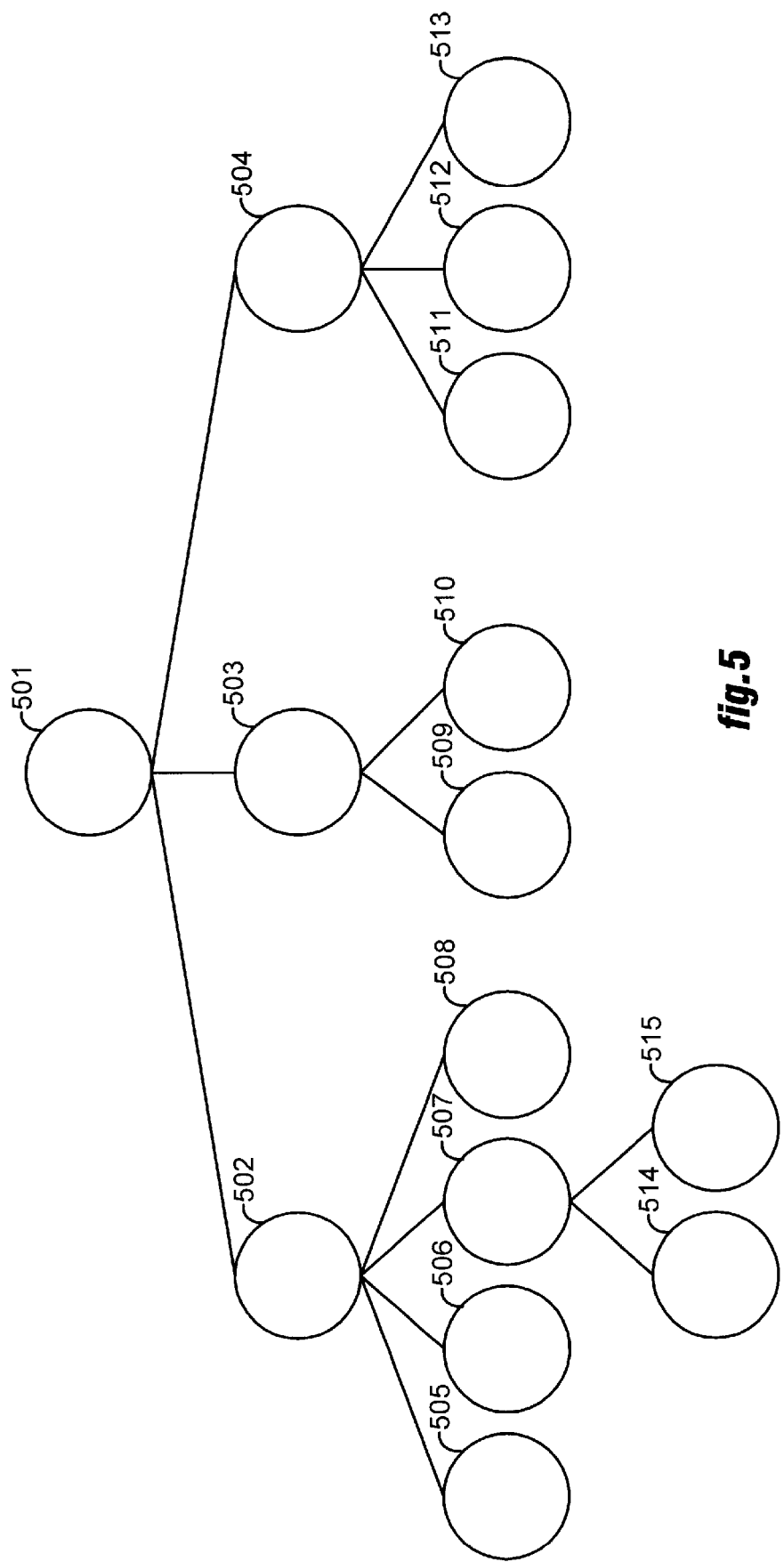
FIG. 5 illustrates a simple example of a hierarchical organization of structures for an integrated circuit.
Figure 6:
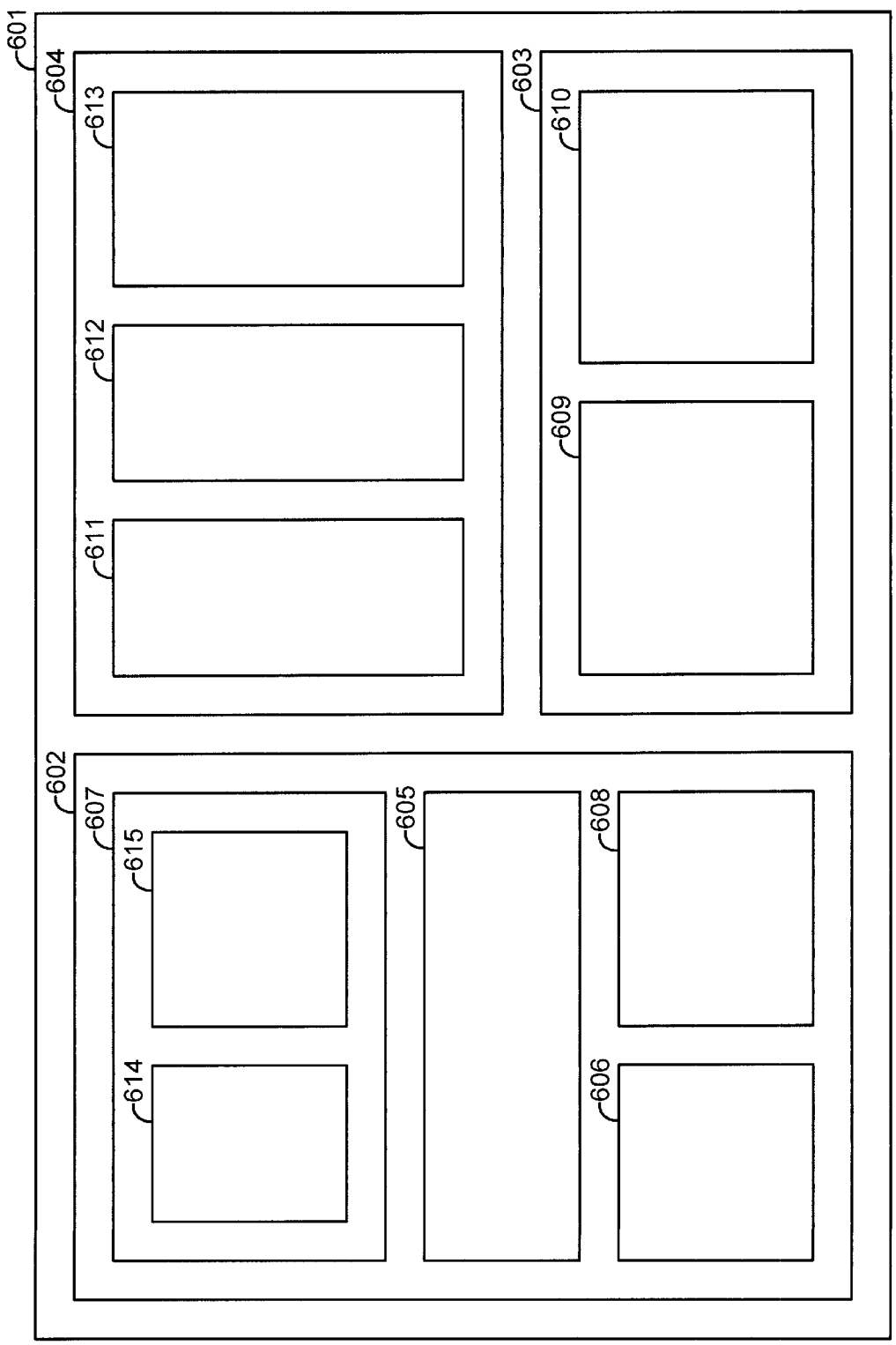
FIG. 6 illustrates a simple example of a top plan view of an outer boundary box layout corresponding to the hierarchical organization of structures of FIG. 5.

FIGS. 5 and 6 are useful for describing the method. In FIG. 5, a simple example of a hierarchical organization of structures for an integrated circuit is illustrated. Circles 501~515 represent structures or cells of the integrated circuit. The connections between structures indicate relationships between the structures. Structure 501 is at a highest level of the hierarchical organization. The structures 502, 503 and 504 are substructures to the structure 501; the structures 505, 506, 507 and 508 are substructures to the structure 502; the structures 509 and 510 are substructures to the structure 503; the structures 511, 512 and 513 are substructures to the structure 504, and the structures 514 and 515 are substructures to the structure 507. The structures 505, 506, 508, 509, 510, 511, 512, 513, 514, and 515 are called root structures, because they have no associated substructures.

Each structure in GDSII format includes a sequence of elements describing that structure. There are seven kinds of elements: boundary, path, structure reference, array reference, text, node, and box. Boundary defines a filled polygon, path defines a wire, structure reference invokes a substructure, array reference invokes an array of substructures, text is for documentation, node defines an electrical path, and box places rectangular geometry. XY records for the elements include coordinate information defining location and/or outlines for the elements. Displayable elements of a structure reside within the outer boundary box of that structure.

FIG. 6 illustrates a simple example of a top plan view of an outer boundary box layout corresponding to the hierarchical organization of the structures depicted in FIG. 5. In the figure, outer boundary boxes 601~615 respectively correspond to the structures 501~515. As is readily apparent from the figure, the outer boundary boxes 602, 603 and 604 (respectively corresponding to the structures 502, 503 and 504) reside within the outer boundary box 601 (corresponding to the structure 501); the outer boundary boxes 605, 606, 607 and 608 (corresponding to the structures 505, 506, 507 and 508) reside within the outer boundary box 602 (corresponding to the structure 502); the outer boundary boxes 609 and 610 (corresponding to the structures 509 and 510) reside within the outer boundary box 603 (corresponding to the structure 503); the outer boundary boxes 611, 612 and 613 (corresponding to the structures 511, 512 and 513) reside within the outer boundary box 604 (corresponding to the structure 504); and the outer boundary boxes 614 and 615 (corresponding to structures 514 and 515) reside within the outer boundary box 607 (corresponding to structure 507).

Therefore, if an outer boundary box resides completely within a window view, then all of its substructures will also reside completely in that window view. Conversely, if an outer boundary box resides completely outside a window view, then all of its substructures will also reside completely outside that window view. However, if an outer boundary box resides partially in and partially out of a window view, then its substructures may be completely in, completely out, or partially in and partially out of the window view.

Now referring back to FIG. 3, in 301, after receiving a window view request from the operator of the client computer 103 and starting at the top level of the hierarchical organization of the structures, the rendering program searches for an unprocessed structure in the current level of the hierarchical organization. If an unprocessed structure is found at the current level of the hierarchical organization, then it is processed according to 305~310. On the other hand, if there are no more unprocessed structures at the current level, then 302~304 are performed.

In 305, the outer boundary box for the structure is retrieved. This information was preferably stored in system memory 102 by the rendering program when it parsed through the GDSII formatted data file 107 while performing 201 of FIG. 2. In 306, the area of the outer boundary box is compared to a threshold value. If the area is greater than or equal to the threshold value, then processing of the pending structure proceeds through 307~310. On the other hand, if the area is less than the threshold value, then processing of the pending structure stops, the pending structure is excluded from the build file, and the method jumps back to 301 to search for another unprocessed structure at the current level.

The threshold value is selected to ensure that the structure will be readily visible to the operator when it is displayed in the requested window view on the display screen of the client computer 103. If the structure is so small that it would not be readily visible to the operator, then there is little value in rendering the structure in an image of the window view. Typical threshold values to accomplish such a purpose are areas equivalent to 1 to 4 pixels on the display screen. As can be readily appreciated, however, for faster rendering, larger areas or threshold values may be used to screen out small structures from the window view.

In 307 and 309, the coordinates of the requested window view are translated or mapped into corresponding XY coordinates of the physical layout, and compared to the coordinates of the pending outer boundary box. In 307, if the outer boundary box is completely within the window view, then processing continues to 308, where the pending structure is added to or included in the build file. In 309, if the outer boundary box is completely outside the window view, then processing of the pending structure stops, the pending structure is excluded from the build file, and the method jumps back to 301 to search for another unprocessed structure at the current level. If the outer boundary box is partially in and partially out of the window view, then in 310, the method jumps to 401 of FIG. 4.

Now referring to FIG. 4, in 401, it is determined whether or not the pending structure is a root structure. If it is not a root structure, then in 402, the method goes down one level in the hierarchical organization of structures and in 403, jumps back to 301 to process the pending structure's substructures through 301~310. On the other hand, if the pending structure is a root structure, then in 404, displayable elements of the pending structure are clipped so that portions of those elements in the window view are added to the build file and portions of those elements outside the window view are excluded from the build file. Then in 403, the method jumps back to 301 to search for another unprocessed structure at the current level.

Referring back to FIG. 3, if there are no more unprocessed structures found at the current level in 301, then in 302, it is determined whether or not there is currently a higher level in the hierarchical organization of structures. This allows the method to continue processing structures at a certain level after substructures of one of the structures at that level have been processed. Accordingly, if there is a higher level, then in 304, the method goes back up to the higher level of the parent structure of the pending structure, and repeats 301 to search for another unprocessed structure at that level. On the other hand, if there is not a higher level, then the method is back up to the highest level of the hierarchical organization of structures and has completed its processing of the structures. At that point, in 303, the method goes to 203 of FIG. 2 to draw the resulting image file of the window view from information in the build file.

Although the various aspects of the present invention have been described with respect to a preferred embodiment, it will be understood that the invention is entitled to full protection within the full scope of the appended claims.

We claim:

1. A method for generating information for a window view of an integrated circuit from layout-formatted data, comprising:

generating outer boundary boxes for structures of an integrated circuit from layout-formatted data;

generating a build file by including information of a first group of said structures having areas greater than a threshold value and outer boundary boxes completely within a window; and generating information of a window view of said integrated circuit from the information thus included in said build file.

2. The method according to claim 1, wherein said generating a build file further comprises excluding information of a second group of said structures having outer boundary boxes completely outside said window.

3. The method according to claim 2, wherein said generating a build file further comprises clipping elements of a third group of said structures having outer boundary boxes partially in said window so as to include portions of said elements that are greater in area than said threshold value and within said window, and exclude portions of said elements outside said window.

4. The method according to claim 3, wherein said threshold value is selected such that said structures and portions of said elements included in said build file are readily visible when displayed in said window view of said integrated circuit.

5. The method according to claim 3, wherein said layout-formatted data is in a GDSII format.

6. The method according to claim 3, wherein said structures of said integrated circuit are organized in a hierarchical organization in said layout-formatted data.

7. The method according to claim 6, wherein said generating a build file comprises starting at a top level of said hierarchical organization, (a) including structures having areas greater than said threshold level and completely within said window in said build file, (b) excluding structures completely outside said in window from said build file, and (c) dropping down one level for structures partially in said window to repeat (a) through (c) until a bottom level of said hierarchical organization is reached, in which case, elements of structures partially in said window are clipped so that portions of said elements having areas greater than said threshold value and within said window are included in said build file, and portions of said elements outside said window are excluded from said build file.

8. A method for generating information for a window view of an integrated circuit from layout-formatted data, comprising:

generating outer boundary boxes for structures of an integrated circuit from layout-formatted data;

generating a build file by including information of structures having outer boundary boxes completely within a window, excluding information of structures having outer boundary boxes completely outside said window, and clipping elements of structures having outer boundary boxes partially in and partially out of said window so that portions of said elements within said window are included in said build file and portions of said elements outside said window are excluded from said build file; and generating information of a window view of said integrated circuit from the information thus included in said build file.

9. The method according to claim 8, wherein said layout-formatted data is in a GDSII format.

10. The method according to claim S, wherein said structures of said integrated circuit are organized in a hierarchical organization in said layout-formatted data.

11. The method according to claim 10, wherein said generating a build file comprises starting at a top level of said hierarchical organization, (a) including structures having outer boundary boxes completely within said window in said build file, (b) excluding structures having outer boundary boxes completely outside said in window from said build file, and (c) dropping down one level for structures having outer boundary boxes partially in said window to repeat (a) through (c) until a bottom level of said hierarchical organization is reached, in which case, elements of structures having outer boundary boxes partially in said window are clipped so that portions of said elements within said window are included in said build file and portions of said elements outside said window are excluded from said build file.

* * * * *